United States Patent
Klingbeil, Jr. et al.

[11] Patent Number: 5,882,961
[45] Date of Patent: Mar. 16, 1999

[54] METHOD OF MANUFACTURING SEMICONDUCTOR DEVICE WITH REDUCED CHARGE TRAPPING

[75] Inventors: Lawrence S. Klingbeil, Jr., Chandler; Mark R. Wilson, Phoenix, both of Ariz.

[73] Assignee: Motorola, Inc., Schaumburg, Ill.

[21] Appl. No.: 940,097

[22] Filed: Sep. 29, 1997

Related U.S. Application Data

[63] Continuation of Ser. No. 526,424, Sep. 11, 1995, abandoned.
[51] Int. Cl.$^6$ .................................................. H01L 21/338
[52] U.S. Cl. ........................... 438/180; 438/184; 438/516; 438/520; 438/525
[58] Field of Search ..................... 437/24, 37, 44, 437/405, 415, 241, 912, 35, 22; 438/37, 167, 180, 184, 516, 520, 525, 528

[56] References Cited

U.S. PATENT DOCUMENTS

| | | | |
|---|---|---|---|
| 4,081,292 | 3/1978 | Aoki et al. | 437/20 |
| 4,126,880 | 11/1978 | Tamaki et al. | 437/241 |
| 4,197,144 | 4/1980 | Kirkpatrick et al. | 437/37 |
| 4,226,650 | 10/1980 | Takahashi et al. | 437/152 |
| 4,535,528 | 8/1985 | Chen et al. | 437/37 |
| 4,612,560 | 9/1986 | Dortu et al. | 257/280 |
| 4,855,246 | 8/1989 | Codella et al. | 437/41 SH |
| 4,884,079 | 11/1989 | Inoue et al. | 350/331 |
| 4,956,314 | 9/1990 | Tam et al. | 437/241 |
| 4,992,387 | 2/1991 | Tamura | 437/41 SH |
| 5,028,564 | 7/1991 | Chang et al. | 437/160 |
| 5,162,884 | 11/1992 | Liou et al. | 437/233 |
| 5,164,329 | 11/1992 | Moyer et al. | 437/126 |
| 5,204,278 | 4/1993 | Imamura et al. | 437/912 |
| 5,217,908 | 6/1993 | Nakanishi | 437/37 |
| 5,250,455 | 10/1993 | Ohzone et al. | 437/37 |
| 5,264,380 | 11/1993 | Pfiester | 437/37 |
| 5,330,584 | 7/1994 | Saga et al. | 136/255 |
| 5,403,761 | 4/1995 | Rha | 437/21 |

FOREIGN PATENT DOCUMENTS

| | | | |
|---|---|---|---|
| 0 075 874 | 4/1983 | European Pat. Off. | 437/37 |
| 56-67972 | 6/1981 | Japan | 437/37 |
| 62-43150 | 2/1987 | Japan | 437/37 |
| 2199843 | 8/1990 | Japan | 437/912 |
| 4-94570 | 3/1992 | Japan | 437/35 |
| 4-370936 | 12/1992 | Japan | 437/35 |
| 5275464 | 10/1993 | Japan | 437/912 |

OTHER PUBLICATIONS

IEEE, GaAs IC Symposium, Tkachenko et al., T.D. Harris et al., D. M. Hwang and L. Aucoin et al., "Hot–Electron–Induced Degradation of Metal–Semiconductor Field–Effect Transistors", 1994, pp. 259–262.

S. Wolf and R.N. Tauber, Silicon Processing for the VLSI Era, vol. 1—Process Technology, "Ion Implantation For VLSI", Chapter 9, pp. 280–330, 1986.

*Primary Examiner*—Michael Trinh
*Attorney, Agent, or Firm*—George C. Chen

[57] ABSTRACT

A semiconductor device (20) is fabricated by doping a dielectric layer (29) located over the surface of a semiconductor substrate (21). The dielectric layer (29) contains nitrogen and is doped with silicon ions by using an ion implantation process (15) such that a peak concentration (32) of the silicon ions remains in the dielectric layer (29) during the ion implantation process (15). Doping the dielectric layer (29) reduces charge trapping in the dielectric layer (29) and reduces power slump in the semiconductor device (20) during high frequency operation.

11 Claims, 2 Drawing Sheets

METHOD OF MANUFACTURING SEMICONDUCTOR DEVICE WITH REDUCED CHARGE TRAPPING

This application is a continuation-in-part of prior application Ser. No. 08/526,424, filed Sep. 11, 1995, abandoned.

BACKGROUND OF THE INVENTION

This invention relates, in general, to a semiconductor device and its method of manufacture, and more particularly, to a semiconductor device having improved electrical performance under high frequency operation.

The phenomenon of hot electrons trapped in gate oxides of silicon based metal-oxide-semiconductor field effect transistor (MOSFETs) is well documented and is widely accepted. The hot electron or charge trapping of MOSFETs alters certain MOSFET electrical characteristics such as, for example, threshold voltage.

A similar phenomenon has been observed during the high frequency operation of metal-semiconductor field effect transistors (MESFETs). However, because MESFETs do not have a gate oxide like MOSFETs, charge trapping in a MESFET occurs in a dielectric layer adjacent to the gate instead of under the gate. Under high frequency or radio frequency (rf) drive, the output power of a MESFET is expected to increase along with its output current. However, what is often measured for MESFETs operated at high rf drive is a decrease in output current and a decrease in output power, commonly known as "power slump" or "power sag". The degradation in MESFET performance can be attributed to the charge trapping phenomenon.

Accordingly, a need exists for a semiconductor device having improved electrical performance under high frequency operation which overcomes the disadvantages of the prior art. The semiconductor device should have reduced charge trapping and power slump during high frequency operation. The semiconductor device and its method of fabrication should be cost effective and manufacturable, should be easily integrated into an existing process flow, and should not significantly increase the cycle time of the process flow.

DETAILED DESCRIPTION OF THE DRAWINGS

The present invention reduces charge trapping in a semiconductor device by doping a dielectric layer located over the surface of a semiconductor substrate. The dielectric layer preferably contains nitrogen and is preferably doped with silicon ions by using an ion implantation process such that a peak concentration of the silicon ions remains in the dielectric layer during the ion implantation process.

Figure 1:
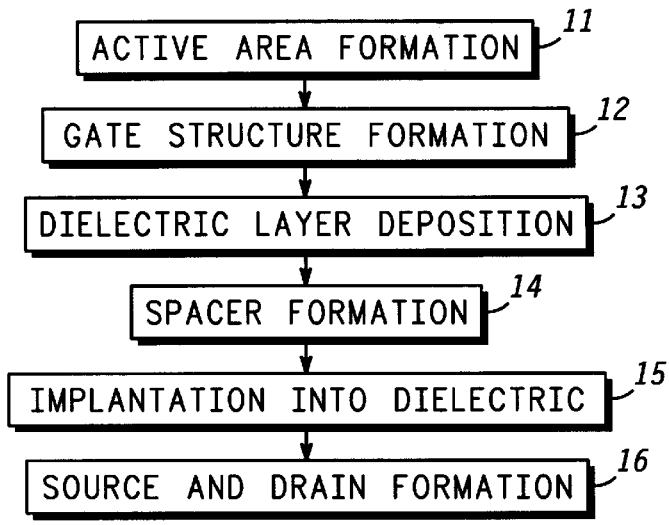
FIG. 1 outlines a process flow for manufacturing a semiconductor device in accordance with the present invention.

Turning to the figures for a more detailed description of the subject invention, FIG. 1 outlines a process flow 10 for manufacturing a semiconductor device in accordance with the present invention. Step 11, the first step of process flow 10, is labeled as an active area formation. One embodiment of a completed active area formation is illustrated in FIG. 2 in an enlarged cross-sectional view.

Figure 2:
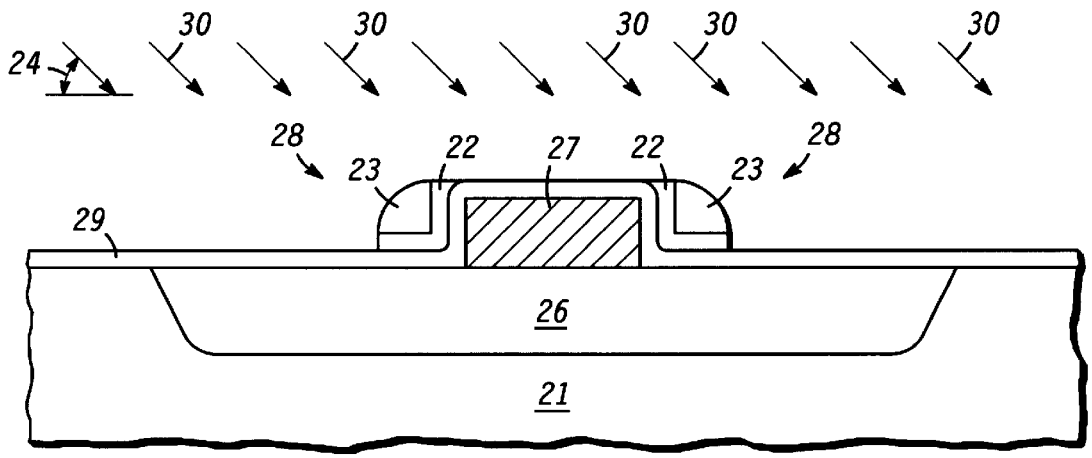
FIG. 2 illustrates an enlarged, cross-sectional view of a semiconductor device during an intermediate manufacturing step.

FIG. 2 illustrates an active area or channel region 26 of a semiconductor device 20 in a substrate 21. Substrate 21 can contain a plurality of semiconductor devices and is preferably comprised of a compound semiconductor material including, but not limited to, gallium arsenide, aluminum gallium arsenide, indium gallium arsenide, or indium phosphide. Channel region 26 can be formed by first using a layer of patterned photoresist as an ion implantation mask to define the width of channel region 26 and then using an ion implantation process to introduce dopants into channel region 26. Multiple species of dopants including, but not limited to, silicon or beryllium can be implanted into channel region 26 to form an n-type or p-type doped region. If substrate 21 contains multiple channel regions requiring different doping concentrations, different photoresist layers can be patterned over substrate 21 to permit ion implantation into specific channel regions while blocking the ion implantation from other channel regions. As known in the art, an implant screen can also be used during the active area formation of step 11.

Continuing with the next step of process flow 10, which is step 12 of FIG. 1, a gate structure 27 is disposed over channel region 26 of substrate 21 as represented in FIG. 2. Gate structure 27 preferably has a thickness of approximately 1,000 to 7,500 angstroms (Å) and comprises an electrically conductive material, preferably a refractory metal such as titanium tungsten nitride, tungsten silicon, tungsten nitride, or tungsten silicon nitride, among others.

Gate structure 27 can be manufactured by depositing a layer of gate material over substrate 21, by patterning a photoresist layer over the layer of gate material to define the width of gate structure 27, and by etching the layer of gate material. Alternatively, a hard mask of silicon dioxide, for example, can be located over gate structure 27 to define gate structure 27 during etching of the layer of gate material. Gate structure 27 can be provided over substrate 21 by reactively sputtering titanium and tungsten using argon and nitrogen gases. Gate structure 27 can be etched using an RIE chemistry comprised of $CHF_3$, $C_2F_6$, $SF_6$, or the like. Carrier gases such as helium or nitrogen, for example, can also be introduced into the RIE chemistry.

Other processes in the art which protect the surface of substrate 21 from residues and damage during the gate structure formation process are considered within the scope and spirit of the present invention and, therefore, can be used in place of the above described process.

After completing the gate structure formation of step 12 and before executing step 13 of FIG. 1, an optional implant can be performed into substrate 21 to create lightly doped source and drain regions (not shown) within substrate 21 of FIG. 2.

Referring now to step 13 of process flow 10, dielectric layers 22, 23, and 29 are disposed over channel region 26, gate structure 27, and substrate 21. First, dielectric layer 29 is deposited over substrate 21 using a chemical vapor deposition (CVD) process and preferably has a thickness of roughly 100 to 1,000 Å in order to prevent outgassing of substrate 21 during subsequent high temperature processing steps including, but not limited to, an activation anneal step for channel region 26. While dielectric layer 29 preferably contains nitride and most preferably is silicon nitride, other dielectric layer compositions having similar outgassing prevention properties can also be used for dielectric layer 29.

Next, dielectric layer 22 is disposed over dielectric layer 29. Dielectric layer 22 is comprised of a metal, preferably aluminum, and is provided over substrate 21. Dielectric layer 22 is most preferably an electrically insulating layer of aluminum nitride and can be provided by reactively sputtering aluminum using argon and nitrogen gases at room temperature. Other processes such as metal organic chemical vapor deposition (MOCVD), for example, can also be used. Dielectric layer 22 has a thickness preferably between about 100 and 1,000 Å.

Finally, dielectric layer 23 is provided over dielectric layer 22. Dielectric layer 23 preferably comprises silicon dioxide because of its common usage and wide availability, but other materials such as silicon oxynitride, for example, can also be used. Similar to dielectric layer 29, dielectric layer 23 can be deposited using a CVD process. The preferred thickness of dielectric layer 23 is approximately 500 to 7,500 Å. The total as-deposited thickness of dielectric layers 22, 23, and 29 should be greater than or equal to the thickness of gate structure 27.

Turning to step 14 in process flow 10 of FIG. 1, sidewalls or spacer 28 is formed adjacent to gate structure 27 as portrayed in FIG. 2. Spacer 28 is formed by isotropically etching dielectric layer 23 while using dielectric layer 22 as an etch stop. The use of aluminum nitride as an etch stop during the etching of an overlying silicon dioxide layer is described in co-pending and commonly owned U.S. application Ser. No. 08/254,209 which is hereby incorporated herein by reference. Alternatively, spacer 28 may be formed from dielectric layer 23 without using dielectric layer 22.

The isotropic etching of dielectric layer 23 is preferably performed without a photoresist mask. A dry etch such as, for example, a reactive ion etch (RIE) or a wet etch can be used to etch dielectric layer 23. In an RIE process, a fluorine based plasma comprising $C_2F_6$, $SF_6$, $NF_3$, $CF_4$, $CHF_3$, among others, is preferably used. In a wet etch, a solution containing buffered hydroflouric acid (HF), for example, can be used. Regardless of the chemistry used to etch dielectric layer 23, the chemistry should not significantly etch the underlying dielectric layer 22.

After etching dielectric layer 23, dielectric layer 22 is etched, preferably using ammonium hydroxide ($NH_4OH$). Most preferably, the wet etch chemistry comprises $NH_4OH:H_2O$ (1:9) and is used at a high flow rate and at room temperature for a specified time. Other $NH_4OH:H_2O$ ratios ranging from 1:1 to 1:50 and other temperatures ranging from 15 to 50 degrees Celsius (°C.) can also be used. While other etchants such as, for example, KOH, $H_3PO_4$, HF, or HCl can be used, $NH_4OH:H_2O$ is preferred due to its reproducible etch rate and its selectivity to silicon dioxide and silicon nitride. The etchants used to etch dielectric layer 22 should not significantly etch dielectric layers 23 or 29.

With spacer 28 completed, dielectric layer 29 remains over substrate 21 as depicted in FIG. 2, and step 15 of process flow 10 in FIG. 1 is performed. An ion implantation process, indicated by implant or arrows 30 in FIG. 2, is used to dope dielectric layer 29. Singly charged silicon ions, each having a mass of 28 atomic mass units (AMU), are preferably used for the dopant and are preferably implanted into dielectric layer 29 at an implant energy of roughly 25–65 kiloelectron volts (KeV), an implant dose of approximately $5 \times 10^{12} - 5 \times 10^{13}$ atoms per centimeter squared (atoms/cm²),
and an implant angle of about 45 degrees (°). Alternatively, other ions such as beryllium, fluorine, oxygen, or argon, for example, can be used in place of the singly charged silicon ions. A patterned photoresist layer exposing portions of dielectric layer 29 which are over channel region 26 can optionally be used as an implant mask during the implantation of step 15.

In order to introduce dopants into portions of dielectric layer 29 which are located underneath spacer 28, the implantation of step 15 is preferably performed at an angle of about 45° from the surface of substrate 21 as indicated by angle 24 in FIG. 2. A higher or lower angle can be used during implantation depending upon the desired penetration beneath spacer 28. Because of the preferred 45° implantation angle, substrate 21 is also preferably rotated during implantation to eliminate implant shadowing such that all exposed surfaces of dielectric layer 29 are implanted.

Figure 3:
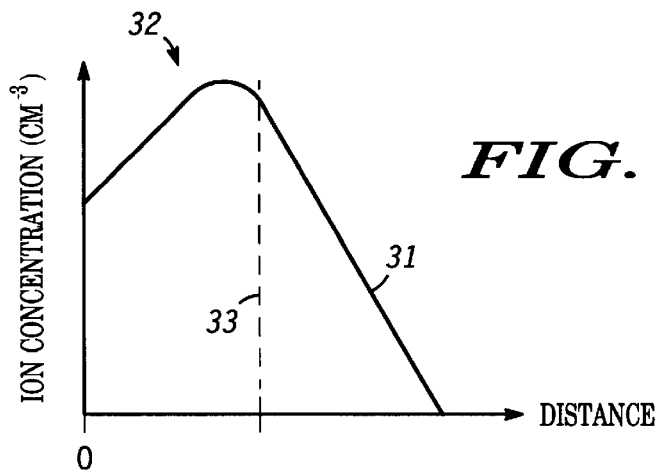
FIG. 3 represents a distribution of ions implanted into a substrate.

A peak concentration of the dopant from step 15 should remain in dielectric layer 29 as indicated by the graph of FIG. 3. The ordinate, or Y-axis, of the graph represents a concentration in units of per centimeter cubed ($cm^{-3}$) of the dopant implanted during step 15. The abscissa, or X-axis of the graph represents a distance into an object being implanted. When the object being implanted is dielectric layer 29 overlaying substrate 21, the portion of the abscissa from the origin of the graph, which is labeled "0", to a dashed line 33 represents dielectric layer 29, and the portion of the abscissa which is to the right of dashed line 33 represents substrate 21. Dashed line 33 represents the interface between dielectric layer 29 and substrate 21. A curve 31 represents a concentration of the implanted dopant from step 15 with a peak concentration located at a point 32 of curve 31. Note that point or peak concentration 32 is located to the left of dashed line 33 which indicates that the peak concentration is located within dielectric layer 29.

The actual implant energy which should be used in step 15 to keep peak concentration 32 within dielectric layer 29 is dependent upon a number of factors. For example, if dielectric layer 29 were thicker, a higher implant energy can be used. Additionally, if a different material having a lower density than silicon nitride were used for dielectric layer 29, a lower implant energy can be used. Moreover, if the dopant being implanted had a higher AMU, a higher implant energy can be used.

Representing a Gaussian distribution, curve 31 depicts a portion of the dopant from step 15 implanted into substrate 21. As known in the art, this phenomenon is a result of ion implantation physics which is described in detail in *Silicon Processing for the VLSI Era, Volume* 1: *Process Technology*, edited by Wolf and Tauber, on pages 280–330, and which is hereby incorporated herein by reference.

It is understood that the implantation process of step 15 can be performed after deposition of dielectric layer 29, before deposition of dielectric layers 22 and 23, and before formation of spacer 28. However, when portions of dielectric layer 29 which are adjacent to gate structure 27 and which are located on substrate 21 are implanted with a dopant during step 15, the implanted dopant can change the electric field within portions of channel region 26 which are adjacent to gate structure 27 and can significantly lower the breakdown voltage of semiconductor device 20.

Therefore, for applications requiring higher breakdown voltages, it is preferred to fabricate semiconductor device 20 by performing step 15 (which is the implantation of dielectric layer 29) after step 14 (which is the spacer formation) and not before step 14. In this preferred manner, spacer 28 will serve as an implant mask during step 15 to prevent portions of dielectric layer 29 which are adjacent to gate structure 27 and on substrate 21 from being implanted, and thus, the breakdown voltage of semiconductor device 20 will not be significantly lowered. If even higher breakdown voltages are desired, then the implantation of step 15 should be performed at an angle closer to 90° or more perpendicular to the surface of substrate 21 instead of at the preferred 45° of angle 24 in FIG. 2 to prevent portions of dielectric layer 29 which are underneath spacer 28 from being implanted.

While dielectric layer 29 can be deposited over substrate 21 with a dopant introduced into dielectric layer 29 during the deposition process, dielectric layer 29 is preferably doped during the implantation of step 15 due to the breakdown voltage considerations mentioned above and also due to the higher breakdown voltage requirements of many semiconductor devices operating at high frequencies.

The hot electron trapping or charge trapping of semiconductor device 20 is reduced by introducing the dopant ions of step 15 into dielectric layer 29. As a result of the charge trapping reduction, the phenomenon of "power slump" or "power sag" during high frequency operation is reduced or even eliminated in some cases. The implant dose of step 15 can be adjusted based upon the amount of charge trapping which occurs during the high frequency operation. However, tradeoffs exist between the reduction of power slump and other electrical parameters of semiconductor device 20. For instance, a higher implant dose used during step 15 can reduce a larger power slump but may also reduce the breakdown voltage of semiconductor device 20. However, through experimentation and simulation, the preferred embodiment of the present invention to optimize the high frequency performance of semiconductor device 20 has been determined and has been described in detail above.

Figure 4:
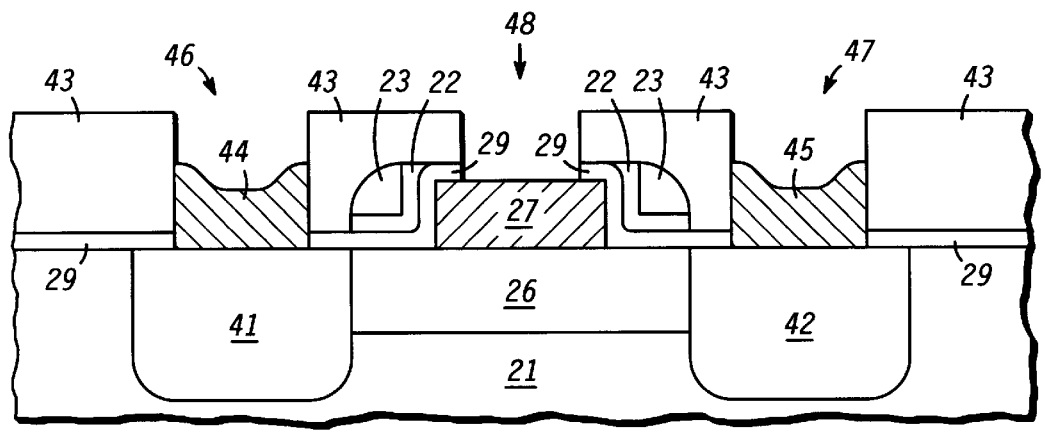
FIG. 4 portrays an enlarged, cross-sectional view of the semiconductor device during a subsequent manufacturing step.

Continuing with process flow 10 of FIG. 1, step 16 completes the formation of source and drain portions in semiconductor device 20 as portrayed in FIG. 4. After the implantation of step 15 is performed, an additional implantation process is used to form source region 41 and drain region 42 within substrate 21. A patterned photoresist layer defines the width of source region 41 and drain region 42 during implantation of the regions. Ions similar to those used to create channel region 26 are used to create source region 41 and drain region 42. As depicted in FIG. 4, source and drain regions 41 and 42, respectively, can extend deeper into substrate 21 compared to channel region 26, or alternatively, source and drain regions 41 and 42, respectively, can be the same depth or more shallow than channel region 26. The ion implantation dosage used for source region 41 and drain region 42 is greater than that used for channel region 26.

Next, a dielectric layer 43 is provided over substrate 21 to a thickness preferably greater than that of gate structure 27 as illustrated in FIG. 4. While, dielectric layer 43 can be similar in composition to dielectric layer 23, other suitable dielectric layers used in semiconductor processing can also be used. A patterned photoresist layer is used during an etch process to form vias 46, 47, and 48 within dielectric layers 43 and 29. Vias 46, 47, and 48 are used to provide electrical coupling for semiconductor device 20.

The etch process for dielectric layer 43 can be similar to that used for dielectric layer 23. The etch process for dielectric layer 29 can utilize either a wet etch or a low power plasma comprising $SF_6$, $NF_3$, or other etchants suitable for use at a low power. Preferably, a low power plasma of approximately 100 to 200 watts is used to reduce the damage created on the surface of substrate 21 as compared to the use of a high power plasma. A damaged surface of substrate 21 creates electrically active defects, or the like, which can degrade the performance of semiconductor device 20 by creating high contact resistance, among other electrical performance anomalies.

Also fabricated during step 16 are ohmic contacts 44 and 45 which are located over substrate 21 and within vias 46 and 47, respectively, which are coupled to source region 41 and drain region 42, respectively, and which represent source contact 44 and drain contact 45, respectively. Ohmic contacts 44 and 45 comprise metallic alloys including, but not limited to, nickel, germanium, gold, or tungsten. While an etching process can be used, ohmic contacts 44 and 45 are preferably fabricated using a manufacturable lift-off process.

First, patterned photoresist is formed over substrate 21 while exposing vias 46 and 47 where ohmic contacts 44 and 45 will be formed. Second, a reactive sputtering process can be used to deposit a layer of ohmic contact material over the patterned photoresist and in vias 46 and 47. The layer is deposited in a nonconformal manner. Next, the patterned photoresist is removed from substrate 21, and the layer of ohmic contact material located over the patterned photoresist is simultaneously "lifted-off" of substrate 21 along with the patterned photoresist while portions of the ohmic contact material in vias 46 and 47 are not lifted-off and remain in vias 46 and 47 to form source contact 44 and drain contact 45. An ohmic anneal preferably ranging from 300° to 650° C. can be used to complete the source and drain formation of step 16 in process flow 10.

As illustrated in FIG. 4, at least a portion of dielectric layer 29 which was implanted during step 15 remains over substrate 21 and channel region 26 to reduce charge trapping within dielectric layer 29 when semiconductor device 20 is operated at high frequencies.

Figure 5:
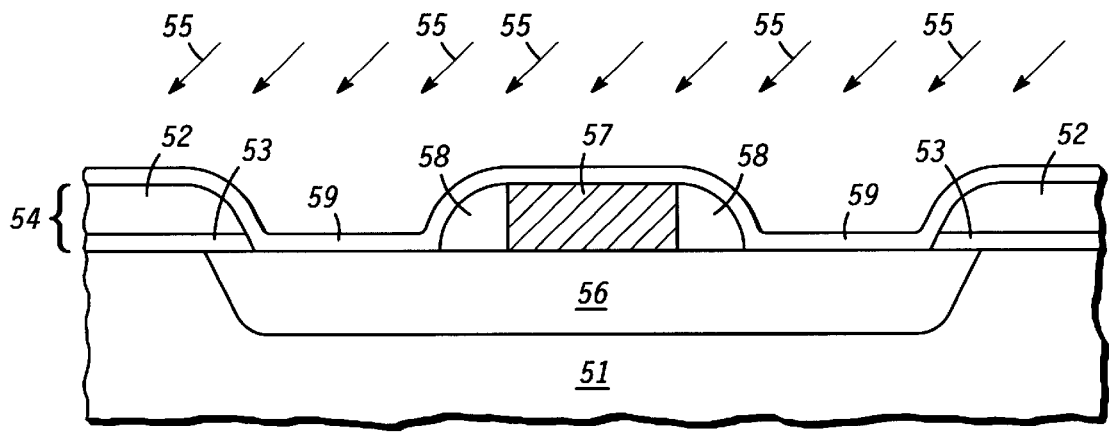
FIGS. 5 and 6 depict alternative embodiments of the subject invention.

Referring now to an alternative embodiment of the subject invention, FIG. 5 depicts a semiconductor device 50. A substrate 51, a channel region 56, a gate structure 57, and a spacer 58 of FIG. 5 can be similar to substrate 21, channel region 26, gate structure 27, and spacer 28, respectively, in FIG. 2. Semiconductor device 50 of FIG. 5 has dielectric stacks 54 which can serve as a self-aligned implant mask during implantation of channel region 56. In FIG. 5, dielectric stacks 54 are composed of dielectric layers 52 and 53 which can be similar in composition to and which can be etched with similar processes as dielectric layers 23 and 29, respectively, in FIG. 2. After formation of dielectric stacks 54, channel region 56 is implanted into substrate 21; gate structure 57 is formed over channel region 56; spacer 58 is formed adjacent to gate structure 57; and then dielectric layer 59 is formed over gate structure 57, spacer 58, dielectric stacks 54, and substrate 51.

Dielectric layer or doped dielectric layer 59 of FIG. 5 is similar in composition and serves a similar purpose as dielectric layer 29 of FIG. 2. An implant 55, which is similar to implant 30 of FIG. 2, is performed such that a peak concentration of the implanted ions remains in dielectric layer 59 during implant 55. Following implant 55, the source and drain formation of step 16 can be performed to complete the fabrication of semiconductor device 50.

Figure 6:
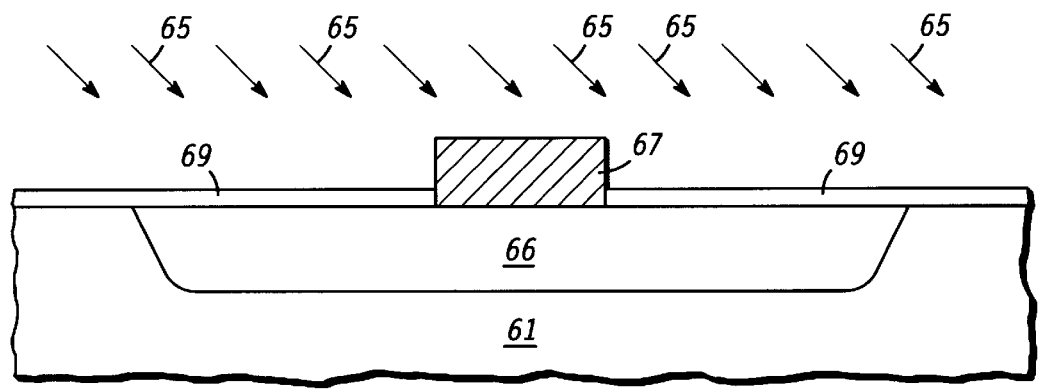

FIG. 6 portrays yet another embodiment of the present invention. A semiconductor device 60 is manufactured in a substrate 61. In FIG. 6, substrate 61, a channel region 66, and a gate structure 67 are similar to substrate 21, channel region 26, and gate structure 27, respectively, of FIG. 2.

First, a dielectric layer 69, which is similar in composition to dielectric layer 29 of FIG. 2, is disposed over substrate 61.

Second, a patterned photoresist layer is formed over dielectric layer 69 to define the width of channel region 66. Next, an implant process is used to dope channel region 66. Dielectric layer 69 serves as an implant screen to reduce channeling and contamination during the implantation process of channel region 66. After the formation of channel region 66, dielectric layer 69 is etched to expose a portion of substrate 61, and gate structure 67 is formed over the exposed portion of substrate 61 as portrayed in FIG. 6. Finally, an implant 65 is performed to dope dielectric layer 69. Implant 65 is similar to implant 30 of FIG. 2.

Optionally, a spacer can be fabricated adjacent to gate structure 67 prior to performing implant 65, and alternatively, implant 65 can be performed prior to the etching of dielectric layer 69 and prior to the formation of gate structure 67. Yet another variation forms channel region 66 prior to depositing dielectric layer 69 and gate structure 67.

While the subject invention has been particularly shown and described mainly with reference to preferred embodiments, it will be understood by those skilled in the art that changes in form and detail may be made without departing from the spirit and scope of the invention. For example, an interconnect structure can be formed over substrate 21 of FIG. 2 to couple multiple semiconductor devices within substrate 21 to form an integrated circuit in substrate 21. Furthermore, the activation anneal process for the dopants in channel region 26 and source and drain regions 41 and 42, respectively can be performed at any suitable time during process flow 10. Additionally, dielectric stacks 54 of FIG. 5 can be similarly incorporated into semiconductor devices 20 and 60 of FIGS. 2 and 6, respectively. Moreover, while depicted as symmetrical devices, electrical specifications may dictate that semiconductor devices 20, 50, and 60 should be asymmetrical semiconductor devices where, for example, the drain region is positioned further away from the gate compared to the source region. Still further, the principles and methods of the present invention can be applied to silicon based semiconductor devices, thin film transistors, silicon on insulator devices, heterojunction and epitaxial devices, and recessed gate devices, among many others.

Therefore, in accordance with the present invention, it is apparent there has been provided a semiconductor device having improved electrical performance under high frequency operation which overcomes the disadvantages of the prior art. The semiconductor device of the subject invention has reduced charge trapping and power slump during high frequency operation. The test results of these improved semiconductor devices have shown other enhanced electrical performance characteristics including reduced gate leakage currents, increased transconductance without changing threshold voltage, and reduced threshold voltage shift. The semiconductor device and its method of fabrication are cost effective and manufacturable, are easily integrated into an existing process flow, and do not significantly increase the cycle time of the process flow.

We claim:

1. A method of manufacturing a semiconductor device, the method comprising the steps of:

providing a substrate;

providing a gate electrode contacting the substrate;

disposing a dielectric layer comprising nitrogen over the substrate and over the gate electrode and at two opposite sides of the gate electrode;

forming a spacer over a portion of the dielectric layer and at two opposite sides of the gate electrode, the portion of the dielectric layer located at the two opposite sides of the gate electrode and located underneath the spacer, the spacer comprised of a dielectric material different from the dielectric layer; and implanting ions into a different portion of the dielectric layer at the two opposite sides of the gate electrode, wherein a peak concentration of the ions remains in the dielectric layer at the two opposite sides of the gate electrode during the implanting step and wherein the spacer prevents the portion of the dielectric layer from being implanted by the ions.

2. The method according to claim 1, further comprising:

providing silicon nitride for the dielectric layer; and providing silicon ions for the ions.

3. The method according to claim 1, wherein the step of providing the substrate includes providing a compound semiconductor material for the substrate.

4. The method according to claim 1, further comprising:

etching openings in the dielectric layer;

forming a source contact and a drain contact in the openings and over the substrate; and keeping a different portion of the dielectric layer over the substrate during manufacturing of the semiconductor device wherein the different portion of the dielectric layer is located between the source contact and the gate structure and between the drain contact and the gate structure and wherein the different portion of the dielectric layer is implanted with the ions during the implanting step.

5. The method according to claim 1, wherein the step of implanting the ions includes selecting the ions from the group consisting of silicon, beryllium, fluorine, and argon.

6. A method of manufacturing a semiconductor device, the method comprising the steps of:

providing a substrate having a surface;

forming a gate electrode contacting the surface of the substrate;

disposing a dielectric layer comprising nitrogen over the surface of the substrate and over the gate electrode and at two opposite sides of the gate electrode;

forming a spacer over a portion of the dielectric layer and at the two opposite sides of the gate electrode, the portion of the dielectric layer located at the two opposite sides of the gate electrode and located underneath the spacer, the spacer comprised of a dielectric material different from the dielectric layer; and implanting ions into a different portion of the dielectric layer at the two opposite sides of the gate electrode wherein a peak concentration of the ions remains in the dielectric layer at the two opposite sides of the gate electrode during the implanting step, wherein the ions are implanted at an angle of greater than or equal to forty-five degrees and less than ninety degrees with respect to the surface of the substrate, and wherein the spacer blocks the ions from the portion of the dielectric layer during the implanting step.

7. The method according to claim 6, wherein the step of implanting the ions includes implanting the ions at a dose greater than or equal to approximately $5 \times 10^{12}$ atoms per centimeter squared and less than $1 \times 10^{13}$ atoms per centimeter squared.

8. The method according to claim 6 wherein the step of disposing the dielectric layer includes providing silicon nitride for the dielectric layer and wherein the step of implanting the ions includes providing silicon for the ions.

9. A method of manufacturing a semiconductor device, the method comprising the steps of:

provinding a compound semiconductor substrate;

forming a gate electrode contacting the compound semiconductor substrate, the gate electrode comprised of tungsten;

depositing a dielectric layer comprising silicon nitride over the compound semiconductor substrate and over the gate electrode and at two opposite sides of the gate electrode wherein the dielectric layer contacts the compound semiconductor substrate and the gate electrode;

forming a dielectric spacer over a portion of the dielectric layer and at the two opposite sides of the gate electrode by depositing a different dielectric layer over the dielectric layer and by isotropically etching the different dielectric layer wherein the different dielectric layer is completely exposed while isotropically etching the different dielectric layer, wherein the portion of the dielectric layer is located at the two opposite sides of the gate electrode and is located underneath the spacer, wherein the dielectric spacer contacts the portion of the dielectric layer at the two opposite sides of the gate electrode and is devoid of directly contacting the gate electrode, wherein the spacer is comprised of a dielectric material different from the dielectric layer, wherein a first portion of the spacer is located at a first one of the two opposite sides of the gate electrode, and wherein a second portion of the spacer is located at a second one of the two opposite sides of the gate electrode and is substantially symmetric to the first portion of the spacer;

implanting ions into a different portion of the dielectric layer at the two opposite sides of the gate electrode, wherein a peak concentration of the ions remains in the dielectric layer at the two opposite sides of the gate electrode during the implanting step, wherein the ions are comprised of silicon, and wherein the dielectric spacer blocks the ions from the portion of the dielectric layer during the implanting step; and keeping the dielectric spacer at the two opposite sides of the gate electrode after implanting the ions.

10. The method according to claim 9 wherein the step of implanting the ions includes implanting the ions at a dose of greater than or equal to approximately $5\times10^{12}$ atoms per centimeter squared and less than $1\times10^{13}$ atoms per centimeter squared.

11. The method according to claim 10 wherein the step of providing the compound semiconductor substrate includes providing the compound semiconductor substrate having a surface wherein the step of implanting the ions includes implanting the ions at an angle of less than ninety degrees and greater than or equal to forty-five degrees with respect to the surface of the compound semiconductor substrate.

* * * * *